United States Patent
Wu et al.

(10) Patent No.: US 9,236,306 B2
(45) Date of Patent: Jan. 12, 2016

(54) METHOD FOR MANUFACTURING SEMICONDUCTOR DEVICE

(71) Applicant: CSMC TECHNOLOGIES FAB1 CO., LTD., Jiangsu (CN)

(72) Inventors: Hsiaochia Wu, Jiangsu (CN); Shilin Fang, Jiangsu (CN); Tsehuang Lo, Jiangsu (CN); Zhengpei Chen, Jiangsu (CN); Shu Zhang, Jiangsu (CN); Yanqiang He, Jiangsu (CN)

(73) Assignee: CSMC TECHNOLOGIES FAB1 CO., LTD., Jiangsu (CN)

( * ) Notice: Subject to any disclaimer, the term of this patent is extended or adjusted under 35 U.S.C. 154(b) by 0 days.

(21) Appl. No.: 14/130,476

(22) PCT Filed: Nov. 28, 2012

(86) PCT No.: PCT/CN2012/085396
§ 371 (c)(1),
(2) Date: Dec. 31, 2013

(87) PCT Pub. No.: WO2013/097573
PCT Pub. Date: Jul. 4, 2012

(65) Prior Publication Data
US 2014/0147980 A1    May 29, 2014

(30) Foreign Application Priority Data

Dec. 29, 2011 (CN) .......................... 2011 1 0451716

(51) Int. Cl.
*H01L 21/8234* (2006.01)
*H01L 21/8238* (2006.01)
*H01L 27/092* (2006.01)

(52) U.S. Cl.
CPC .... *H01L 21/823412* (2013.01); *H01L 21/8238* (2013.01); *H01L 21/82385* (2013.01); *H01L 21/823456* (2013.01); *H01L 21/823807* (2013.01); *H01L 27/0922* (2013.01)

(58) Field of Classification Search
CPC ............... H01L 21/823807; H01L 21/82385; H01L 21/8238; H01L 21/823456; H01L 21/823412; H01L 27/0922
USPC ................... 438/275; 257/343, 335, 301, 288
See application file for complete search history.

(56) References Cited

U.S. PATENT DOCUMENTS

| 6,238,959 | B1 * | 5/2001 | Tung ............................ 438/197 |
| 7,829,947 | B2 * | 11/2010 | Hebert ........................ 257/343 |
| 2005/0106825 | A1 | 5/2005 | You et al. |
| 2010/0176449 | A1 * | 7/2010 | Matsudai et al. ............ 257/335 |
| 2010/0244106 | A1 * | 9/2010 | Parker et al. ................. 257/288 |

FOREIGN PATENT DOCUMENTS

CN    101359664 A    2/2009

* cited by examiner

*Primary Examiner* — Brett Feeney
*Assistant Examiner* — James Chin
(74) *Attorney, Agent, or Firm* — Muncy, Geissler, Olds & Lowe, P.C.

(57) ABSTRACT

A method for manufacturing a semiconductor device according to this specification solves the problem in the prior art that the silicon on the edge of an oxide layer in an LDMOS drift region is easily exposed and causes breakdown of an LDMOS device. The method includes: providing a semiconductor substrate comprising an LDMOS region and a CMOS region; forming a sacrificial oxide layer on the semiconductor substrate; removing the sacrificial oxide layer; forming a masking layer on the semiconductor substrate after the sacrificial oxidation treatment; using the masking layer as a mask to form an LDMOS drift region, and forming a drift region oxide layer above the drift region; and removing the masking layer. The method is applicable to a BCD process and the like.

11 Claims, 11 Drawing Sheets

METHOD FOR MANUFACTURING SEMICONDUCTOR DEVICE

FIELD OF THE INVENTION

The present disclosure relates to the field of semiconductor manufacture, and more particularly relates to a method for manufacturing a semiconductor device.

BACKGROUND OF THE INVENTION

With the continuous development of integrated circuits, in order to save space, a variety of devices are manufactured on the same chip at the same time. For example, in a BCD (Bipolar-CMOS-DMOS) process, high voltage (HV) of the laterally diffused metal oxide semiconductor (LDMOS) and low voltage (LV) of the CMOS devices are integrated on the same chip. Referring to FIG. 1, a semiconductor substrate 100 includes LDMOS 110 and CMOS 120, which are separated by a filed oxide layer 114. The LDMOS 110 has a drift region 111 between the source region and the drain region. The low doped drift region can withstand a higher voltage due to its high impedance. As shown in FIG. 1, the gate 112 of the LDMOS extends to above the drift region oxide layer 113 of the drift region to be regarded as a field plate.

The LV CMOS employs a very thin gate oxide with a thickness of 100 to 200 angstroms, and the quality of the substrate surface determines the quality of the gate oxide. Before growing the gate oxide, the substrate surface must be oxidized, and the oxide layer is removed via etching, thus exposing a high quality gate oxide. This process is also known as the sacrificial oxidation process. Typically, to ensure the complete removal of the sacrificial oxide layer, the etching loss of the oxide layer is greater than the growth of the sacrificial oxide layer.

A manufacturing method for a semiconductor device according to a prior art is shown in FIG. 2 and FIG. 3, which includes:

Step S301, a semiconductor substrate 200 is provided, which includes a LDMOS region and a CMOS region.

Step S302, a masking layer 201 is formed on the semiconductor substrate.

Step S303, an LDMOS drift region 202 is formed using the masking layer 201 as a mask; and a drift region oxide layer 203 is formed on the drift region 202.

Step S304, the masking layer 201 is removed.

Step S305, a sacrificial oxide layer 204 is formed on the semiconductor substrate.

Step S306, the sacrificial oxide layer is removed.

Step S307, a gate oxide 211 and a gate 210 of the CMOS are formed on the semiconductor substrate 500 treated by the sacrificial oxidation. Then subsequent production processes are performed by diffusion, photolithography, etching, thin-film processing.

Referring to FIG. 2 and FIG. 3, since the step of sacrificial oxidation is configured after the step of forming drift region oxide layer, during the etching process of the sacrificial oxide layer, the drift region oxide layer of HV LDMOS is also etched. At a corner area 221 shown in FIG. 4 and FIG. 2G, the edge of the drift region oxide layer is susceptible to damage. In addition, the area shown in dashed lines in FIG. 2F is etched as the drift region oxide layer 203. Although the corner portion on edge of the drift region oxide layer will be oxidized to a certain extent during the process of forming the gate oxide, the oxide layer at the corners is too thin, which will cause breakdown of the LDMOS device due to the higher electric field across the drift region.

One solution in the prior art is to increase the length of the drift region to elevate the breakdown voltage. However, this method also has some problems.

LDMOS device is a single structure unit consisting of hundreds LDMOS units, and the more the number of units, the stronger the drive capability of the LDMOS device. The increased length of the drift region results in an increased area of the LDMOS unit chip, such that the number of unit is decreased, thereby decreasing the drive capability of the LDMOS device under the same area.

Furthermore, on-resistance is a resistance of a working device from drain to source, and when the on-resistance is small, a larger output current occurs, such that the device will be provided with a good switching characteristics and a more powerful drive capability. However, the increased length of the drift region results in an increased on-resistance, thereby further decreasing the drive capability of the LDMOS device.

Accordingly, increasing the length of the drift region to improve the breakdown voltage will increase the on-resistance and chip area, thus reducing the driving capability of the LDMOS device.

When implementing the manufacturing of the LDMOS device, the inventors has found that there are at least the following problems in the prior art:

The silicon on the edge of an oxide layer in an LDMOS drift region is easily exposed, which leads to leakage on the junction edge and causes breakdown of the LDMOS device.

SUMMARY OF THE INVENTION

In order to overcome the deficiencies of the prior art, the present invention provides a semiconductor device manufacturing method to solve the problem that the silicon on the edge of an oxide layer in an LDMOS drift region is easily exposed and causes breakdown of an LDMOS device, thereby improving the breakdown voltage of the LDMOS while ensuring the driving capability of the LDMOS device.

To achieve the above object, the present invention adopts the following technical solutions:

A method for manufacturing a semiconductor device, comprising:

providing a semiconductor substrate comprising an LDMOS region and a CMOS region;

forming a sacrificial oxide layer on the semiconductor substrate;

removing the sacrificial oxide layer;

forming a masking layer on the semiconductor substrate treated by the sacrificial oxidation;

forming an LDMOS drift region using the masking layer as a mask; and forming a drift region oxide layer on the drift region; and removing the masking layer.

Preferably, after removing the sacrificial oxide layer, the method further comprises: forming a gate oxide and a gate of the CMOS on the semiconductor substrate treated by the sacrificial oxidation.

Preferably, the masking layer has a thickness of 250 to 400 angstroms.

Preferably, the masking layer comprising a masking silicon nitride layer and a masking oxide layer, the masking silicon nitride layer is positioned above the masking oxide layer.

Preferably, the masking silicon nitride layer has a thickness of 200 to 350 angstroms; the masking oxide layer has a thickness of 50 to 100 angstroms.

Preferably, the masking silicon nitride layer is formed by thermal oxide growth at a temperature of 600 to 800 degrees.

Preferably, the masking oxide layer is formed by thermal oxide growth at a temperature of 800 to 1000 degrees.

Preferably, a removing thickness of the sacrificial oxide layer is larger than a forming thickness of the sacrificial oxide layer.

Preferably, the forming thickness of the sacrificial oxide layer is 200 to 400 angstroms, the removing thickness of the sacrificial oxide layer is 300 to 600 angstroms.

Preferably, the drift region oxide layer has a thickness of 500 to 1000 angstroms.

The method for manufacturing the semiconductor device according to the present invention solves the problem that the silicon on the edge of an oxide layer in a HV LDMOS drift region is easily exposed, which leads to leakage on the junction edge and causes breakdown of the LDMOS device. In addition, the production cost is down by using a thinner masking layer to form a thinner drift region oxide layer.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout the views.

FIG. 2A to FIG. 2G are schematic cross-sectional diagrams of manufacturing a semiconductor device in the prior art;

DETAILED DESCRIPTION OF THE EMBODIMENTS

Reference will now be made to the drawings to describe, in detail, embodiments of the present back-up power supply for mobile phone. It should be noted that references to "an" or "one" embodiment in this disclosure are not necessarily to the same embodiment, and such references mean at least one.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, shall refer to this application as a whole and not to any particular portions of this application. When the claims use the word "or" in reference to a list of two or more items, that word covers all of the following interpretations of the word: any of the items in the list, all of the items in the list and any combination of the items in the list.

Figure 1:
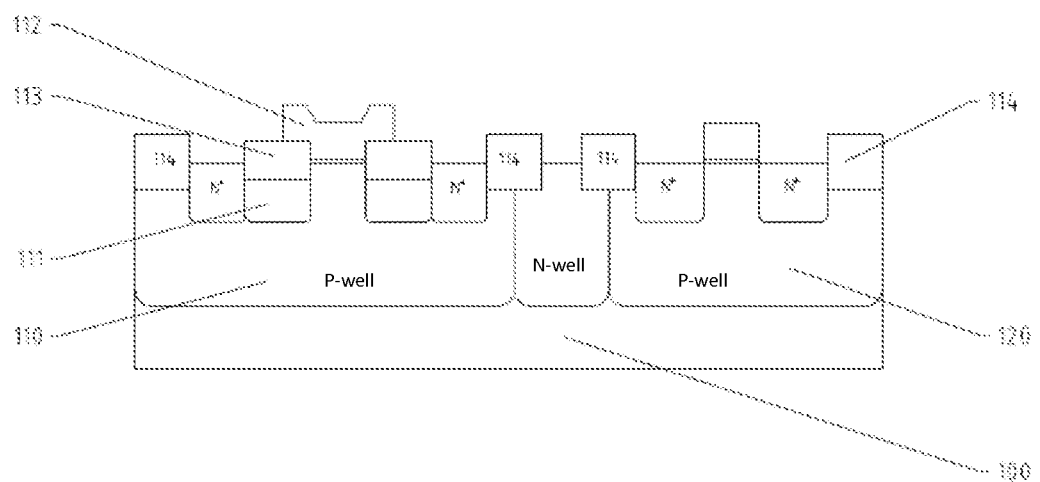
FIG. 1 is a schematic view showing LDMOS and CMOS being integrated on one chip.
Figure 2B:
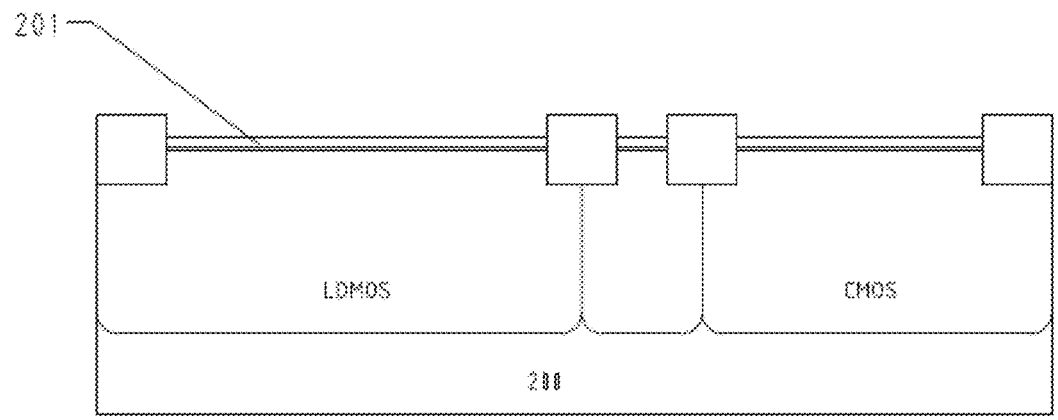
Figure 2C:
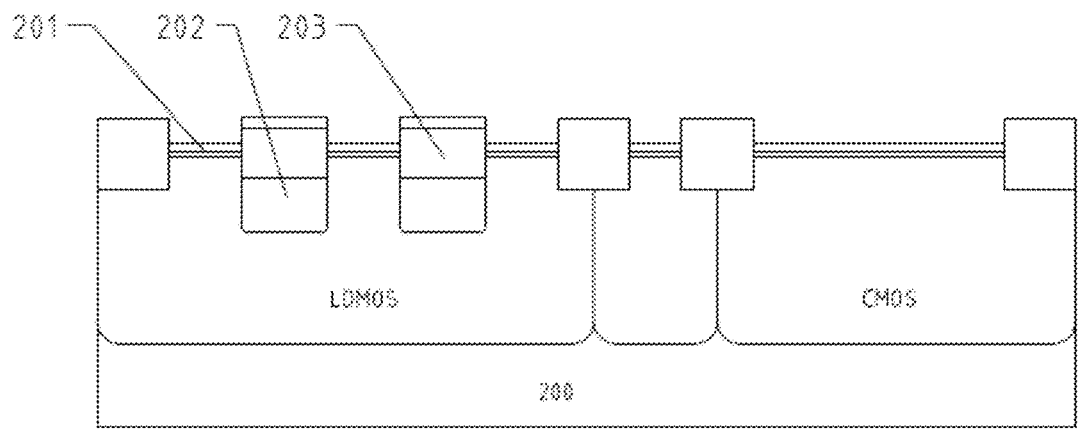
Figure 2D:
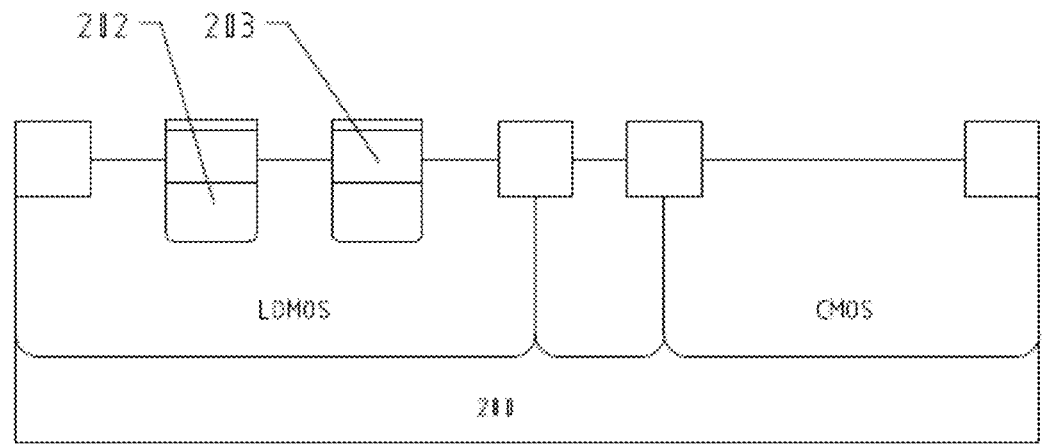
Figure 2E:
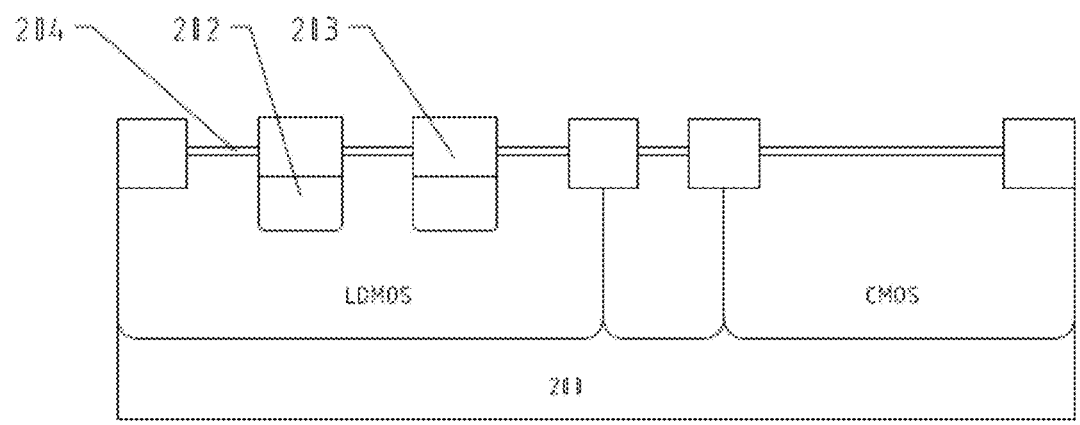
Figure 2F:
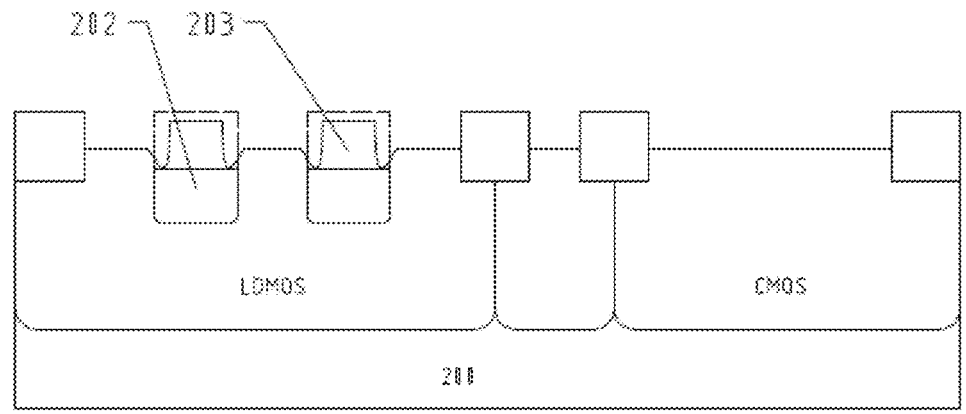
Figure 2G:
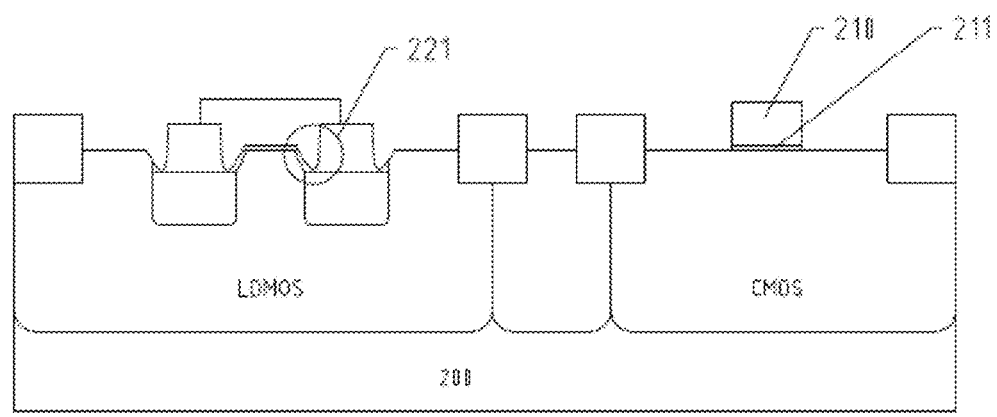
Figure 3:
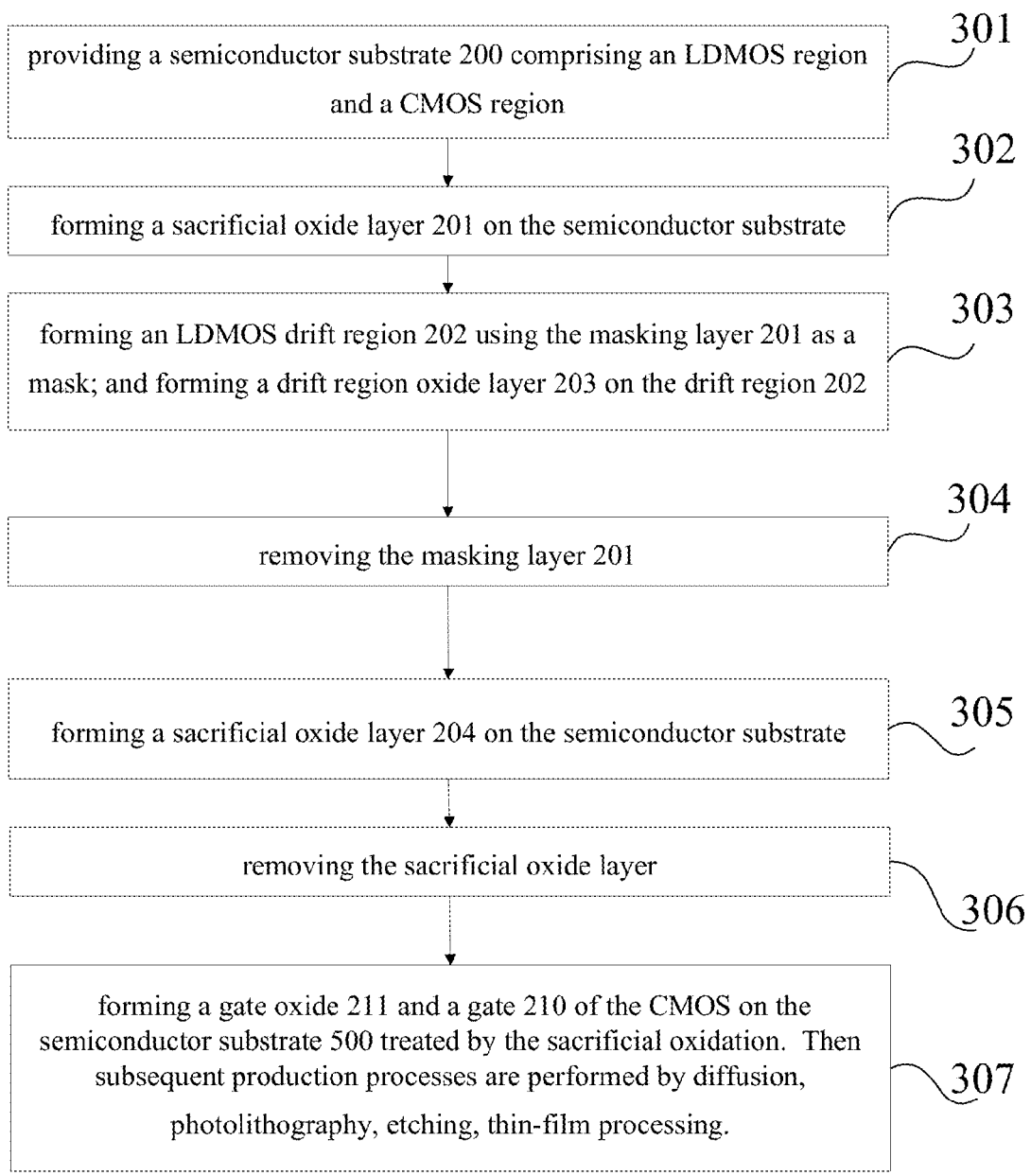
FIG. 3 is a flowchart of a manufacturing method of a semiconductor device in the prior art.
Figure 4:
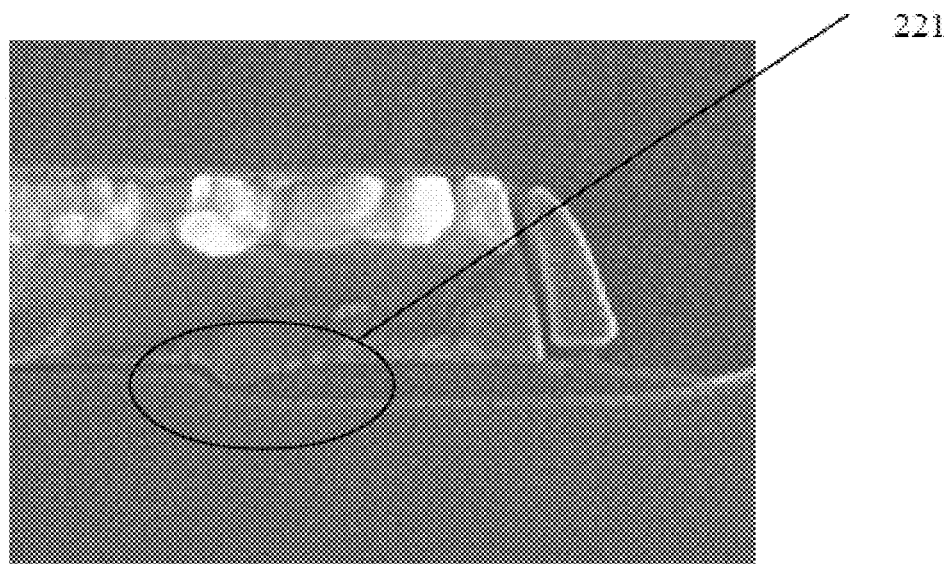
FIG. 4 is an enlarged photo showing a damaged corner of a drift region oxide layer in the prior art.
Figure 5A:
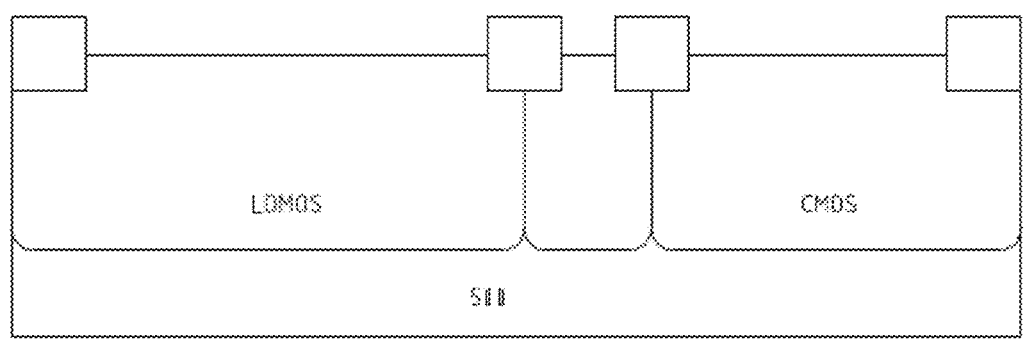
FIG. 5A to FIG. 5G are schematic cross-sectional diagrams of manufacturing a semiconductor device according to an embodiment of the present invention.
Figure 5B:
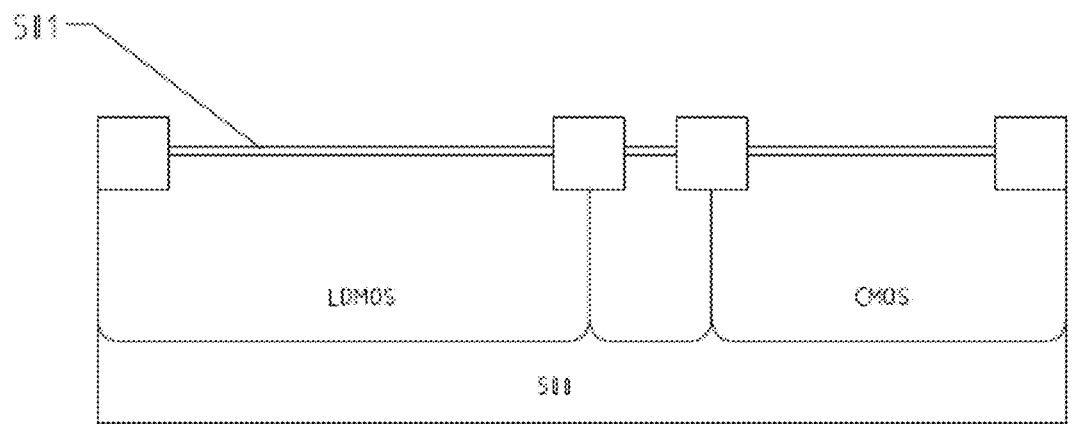
Figure 5C:
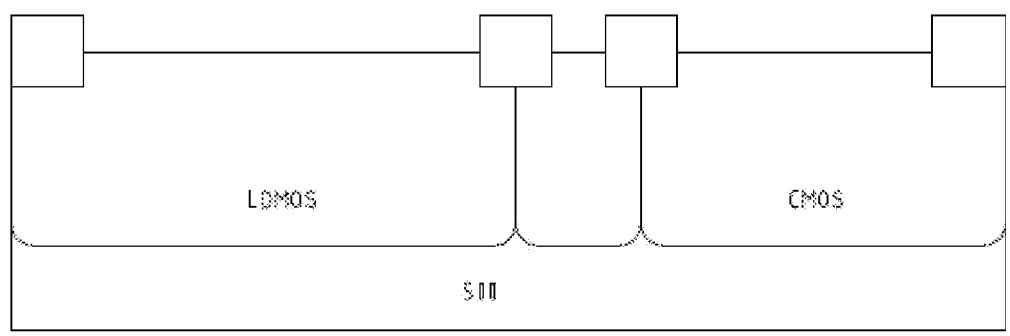
Figure 5D:
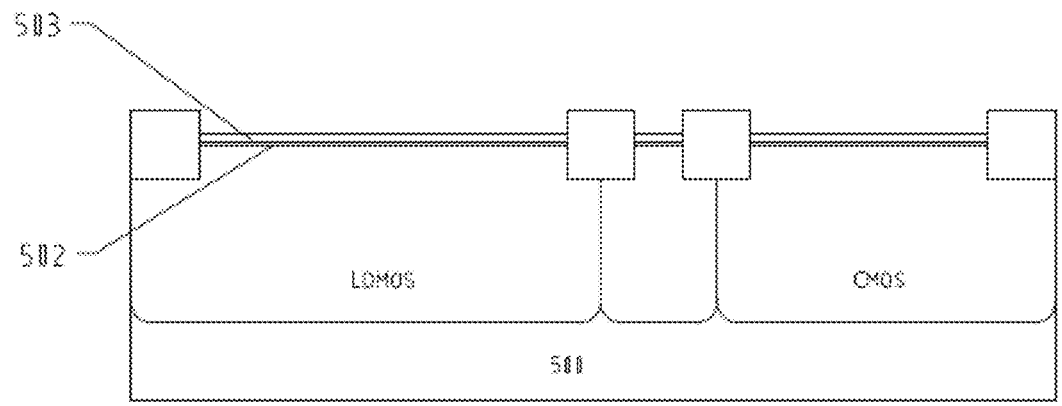
Figure 5E:
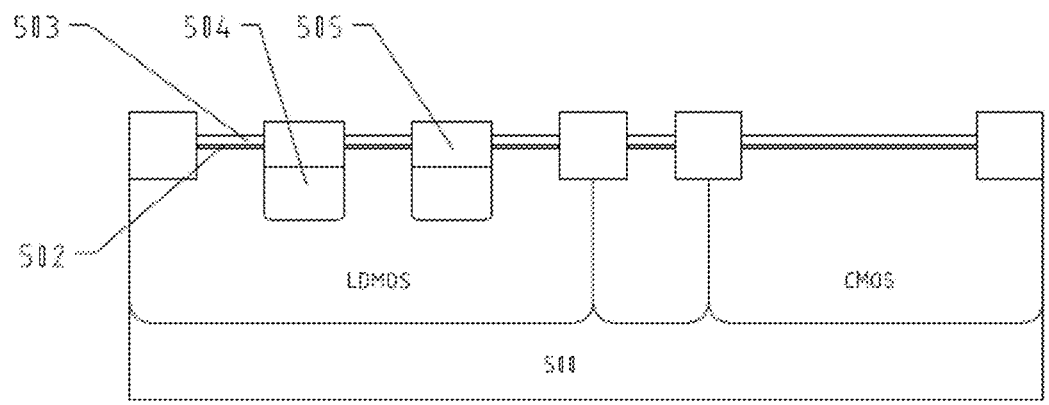
Figure 5F:
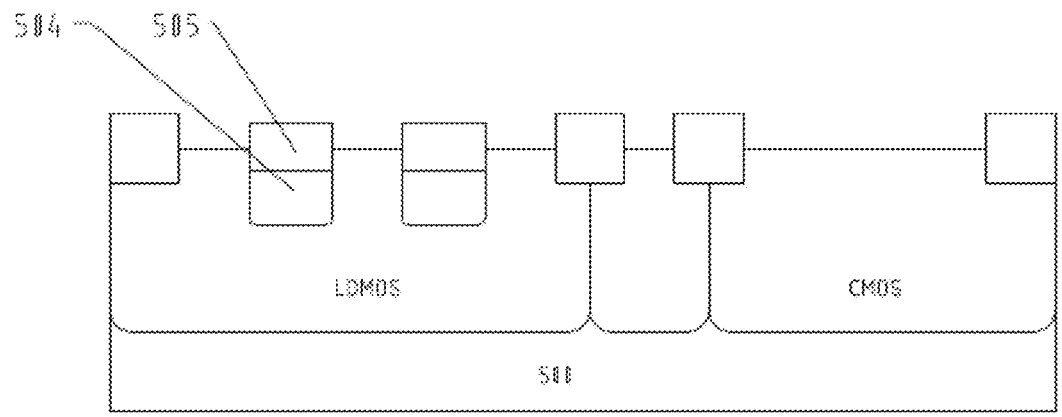
Figure 5G:
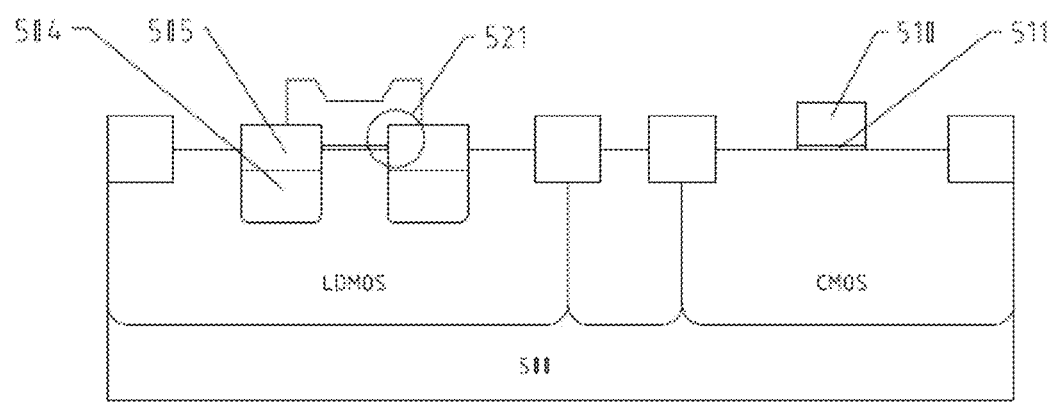
Figure 6:
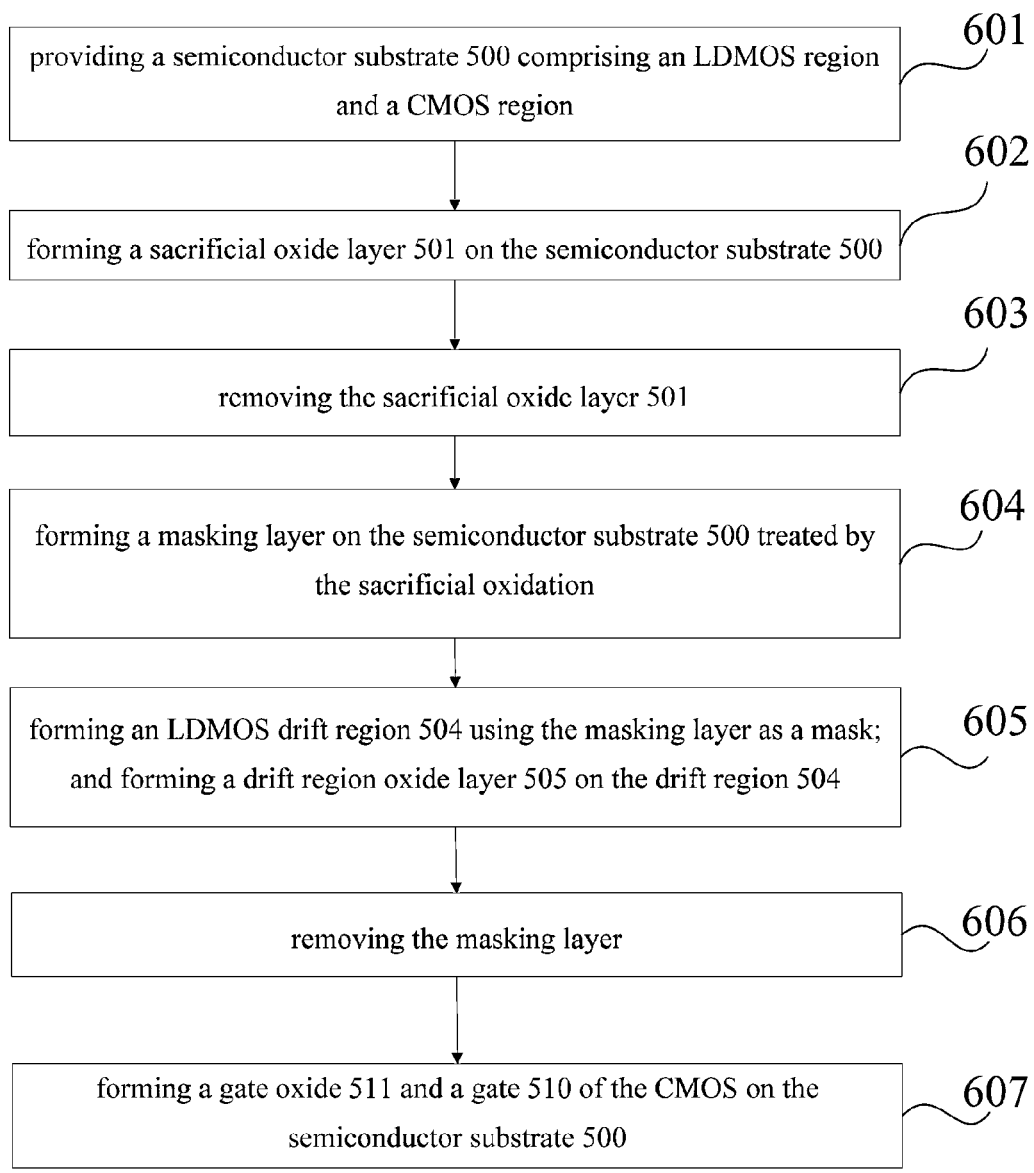
FIG. 6 is a flowchart of a manufacturing method of a semiconductor device according to an embodiment of the present invention.

Referring to FIG. 5 and FIG. 6, an embodiment of a method for manufacturing a semiconductor device is provided, which includes the following steps:

Step S601, a semiconductor substrate 500 is provided, which has an LDMOS region and a CMOS region.

Step S602, a sacrificial oxide layer 501 is formed on the semiconductor substrate 500.

For example, after the manufacture of the lower chip structure is completed, a sacrificial oxide layer 501 is grown on a silicon substrate in a furnace tube at 800° C. to 1000° C., the thickness of the sacrificial oxide layer 501 is 200 to 400 angstroms.

Step S603, the sacrificial oxide layer 501 is removed.

For example, the sacrificial oxide layer 501 is removed by using wet etching, and a wet etching thickness is 300 to 600 angstroms.

Step S604, a masking layer is formed on the semiconductor substrate 500 treated by the sacrificial oxidation.

For example, the masking layer includes a masking oxide (PAD OX) layer 502 a masking silicon nitride (PAD SIN) layer 503, and the masking silicon nitride layer 503 is positioned above the masking oxide layer 502. The PAD OX 502 is grown in a furnace tube at 800° C. to 1000° C. with a thickness of 50 to 100 angstroms. The PAD SIN 503 is grown in a furnace tube at 600° C. to 800° C. with a thickness of 200 to 350 angstroms.

Step S605, an LDMOS drift region 504 is formed using the masking layer as a mask; and a drift region oxide layer 505 is formed on the drift region 504.

For example, the LDMOS drift region 504 is defined by photolithography and exposure, and the LDMOS drift region 504 is exposed by etching PAD OX 502 and PAD SIN 503. Then 200-300 KeV of impurities Boron and 20-30 KeV of impurities Phosphorus are filled in to adjust impurity concentration of the drift region, and the photoresist is then removed by etching. The drift region oxide (OX) layer 505 is thermal oxide grown in a furnace tube at 800° C. to 1000° C. with a thickness of 500 to 1000 angstroms.

Step S606, the masking layer is removed.

For example, PAD OX 502 and PAD SIN 503 are removed by etching.

Step S607, a gate oxide 511 and a gate 510 of the CMOS are formed on the semiconductor substrate 500 treated by the sacrificial oxidation.

For example, a LV CMOS gate oxide (GOX) 511 is thermal oxide grown in a furnace tube at 800° C. to 1000° C. with a thickness of 100 to 200 angstroms. Then subsequent production processes are performed by diffusion, photolithography, etching, thin-film processing.

Figure 7:
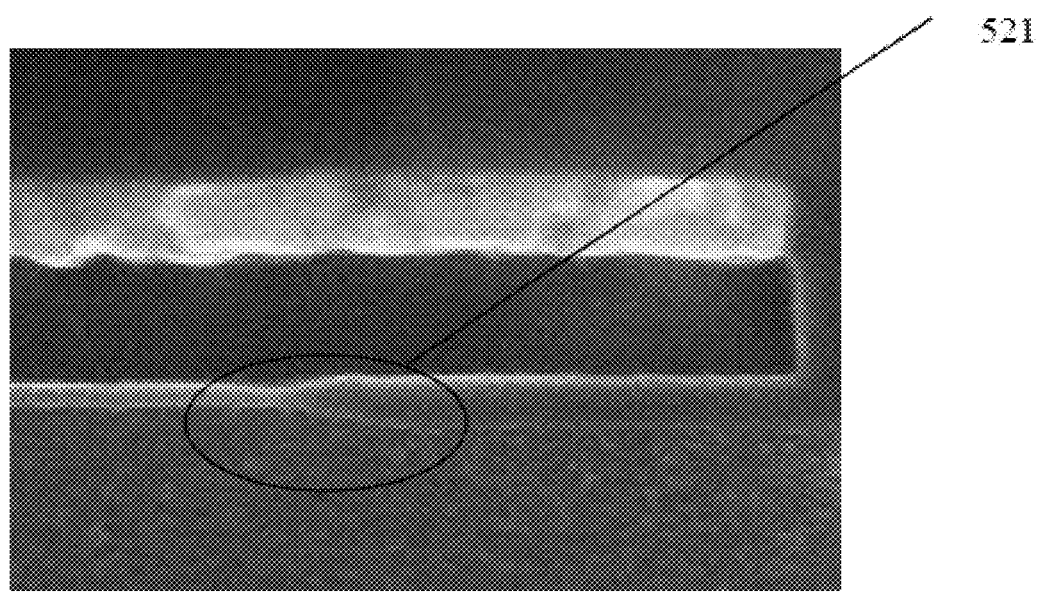
FIG. 7 is an enlarged photo showing a damaged corner of a drift region oxide layer according to an embodiment of the present invention.

Since the step of sacrificial oxidation is configured before the step of forming LDMOS drift region, as shown in FIG. 5G and FIG. 7, the corner portion 521 of the drift region oxide layer will not be damaged.

In the prior art, a portion of thickness of drift region oxide layer will be etched during the process of sacrificial oxidation, therefore, in order to ensure the thickness of the drift region oxide layer after sacrificial oxidation can reach 500 to 1000 angstroms, the thickness of the drift region oxide layer is previously increased to 1500 to 2500 angstroms. Accordingly, the thickness of the drift region oxide layer of the present invention can be reduced, and the thickness of the masking layer can be reduced accordingly. Referring to FIG. 2, the thickness of the previous masking oxide layer is 100 to 300 angstroms, the thickness of the previous masking silicon nitride layer is 100 to 2000 angstroms, such that the production cost is down.

The method for manufacturing the semiconductor device according to the present invention solves the problem that the silicon on the edge of an oxide layer in a HV LDMOS drift region is easily exposed, which leads to leakage on the junction edge and causes breakdown of the LDMOS device. In addition, the production cost is down by using thinner masking layer to form thinner drift region oxide layer.

The present embodiment also can be applied to BCD process and the like.

Although the present invention has been described with reference to the embodiments thereof and the best modes for carrying out the present invention, it is apparent to those skilled in the art that a variety of modifications and changes may be made without departing from the scope of the present invention, which is intended to be defined by the appended claims.

What is claimed is:

1. A method for manufacturing a semiconductor device, comprising:
   providing a semiconductor substrate comprising an LDMOS region and a CMOS region;
   forming a sacrificial oxide layer on the semiconductor substrate;
   removing the sacrificial oxide layer;
   forming a masking layer on the semiconductor substrate after removing the sacrificial oxide layer;
   forming an LDMOS drift region using the masking layer as a mask;
   forming a drift region oxide layer on the drift region; and
   removing the masking layer; and
   forming a gate oxide and a gate of the CMOS on the semiconductor substrate after removing the masking layer.

2. The method according to claim 1, wherein the masking layer has a thickness of 250 to 400 angstroms.

3. The method according to claim 1, wherein the masking layer comprising a masking silicon nitride layer and a masking oxide layer, the masking silicon nitride layer is positioned above the masking oxide layer.

4. The method according to claim 3, wherein the masking silicon nitride layer has a thickness of 200 to 350 angstroms; the masking oxide layer has a thickness of 50 to 100 angstroms.

5. The method according to claim 3, wherein the masking silicon nitride layer is formed by thermal oxide growth at a temperature of 600 to 800 degrees.

6. The method according to claim 3, wherein the masking oxide layer is formed by thermal oxide growth at a temperature of 800 to 1000 degrees.

7. The method according to claim 1, wherein a stripping thickness of the sacrificial oxide layer is larger than a forming thickness of the sacrificial oxide layer.

8. The method according to claim 7, wherein the forming thickness of the sacrificial oxide layer is 200 to 400 angstroms, the stripping thickness of the sacrificial oxide layer is 300 to 600 angstroms.

9. The method according to claim 1, wherein the drift region oxide layer has a thickness of 500 to 1000 angstroms.

10. The method according to claim 1, wherein the LDMOS drift region is formed subsequent to forming the masking layer.

11. The method according to claim 1, wherein the drift region oxide layer is formed directly on the drift region.

* * * * *